US010755777B2

(12) United States Patent
Carissimi et al.

(10) Patent No.: US 10,755,777 B2
(45) Date of Patent: Aug. 25, 2020

(54) TRANSFORMED NON-REPROGRAMMABLE MEMORY ARRAY DEVICES AND METHODS OF MANUFACTURE

(71) Applicant: STMicroelectronics S.r.l., Agrate Brianza (IT)

(72) Inventors: Marcella Carissimi, Treviolo (IT); Marco Pasotti, Travaco' Siccomario (IT); Chantal Auricchio, Cassina de' Pecchi (IT)

(73) Assignee: STMicroelectronics S.R.L., Agrate Brianza (MB) (IT)

( * ) Notice: Subject to any disclaimer, the term of this patent is extended or adjusted under 35 U.S.C. 154(b) by 0 days.

(21) Appl. No.: 16/169,763

(22) Filed: Oct. 24, 2018

(65) Prior Publication Data

US 2019/0130970 A1    May 2, 2019

(30) Foreign Application Priority Data

Oct. 30, 2017   (IT) ..................... 102017000123399

(51) Int. Cl.
  *G11C 13/00*    (2006.01)
  *H01L 45/00*    (2006.01)
  (Continued)

(52) U.S. Cl.
  CPC .......... *G11C 13/0004* (2013.01); *G11C 5/025* (2013.01); *G11C 5/063* (2013.01);
  (Continued)

(58) Field of Classification Search
  CPC .............. G11C 13/004; G11C 13/0026; G11C 13/0069; G11C 13/003; G11C 2213/79;
  (Continued)

(56) References Cited

U.S. PATENT DOCUMENTS 6,021,079 A    2/2000   Worley
9,305,977 B1   4/2016   Hsu
            (Continued)

FOREIGN PATENT DOCUMENTS

CN        206595294 U    10/2017

OTHER PUBLICATIONS

Marco Pasotti et al., "A 32KB 18ns random access time embedded PCM with enhanced program throughput for automotive and smart power applications," ESSCIRC 2017—43rd IEEE European Solid State Circuits Conference, Leuven, Belgium 2017, Sep. 11-14, 2017, pp. 320-323.

*Primary Examiner* — Gene N Auduong
(74) *Attorney, Agent, or Firm* — Slater Matsil, LLP

(57) ABSTRACT

The ROM device has a memory array including memory cells formed by an access element and a data storage element; a high voltage column decoder stage; a high voltage row decoder stage; an analog stage; and a writing stage, wherein the data storage elements are electrically non-programmable and non-modifiable. The memory array is formed by memory cells having a first logic state and by memory cells having a second logic state. The data storage element of the memory cells having the first logic state is formed by a continuous conductive path uninterruptedly connecting the access transistor to the respective bit line, the data storage element of the memory cells having the second logic state is formed by a region of dielectric material insulating the access transistor from the respective bit line.

29 Claims, 11 Drawing Sheets

(51) Int. Cl.
*G11C 5/02* (2006.01)
*H01L 27/24* (2006.01)
*G11C 17/12* (2006.01)
*G11C 5/06* (2006.01)

(52) U.S. Cl.
CPC .......... *G11C 13/003* (2013.01); *G11C 13/004* (2013.01); *G11C 13/0026* (2013.01); *G11C 13/0028* (2013.01); *G11C 13/0069* (2013.01); *G11C 17/12* (2013.01); *H01L 27/2436* (2013.01); *H01L 45/06* (2013.01); *G11C 2213/79* (2013.01)

(58) Field of Classification Search
CPC ......... G11C 5/025; G11C 5/063; G11C 17/12; G11C 13/0028; H01L 27/2436
See application file for complete search history.

(56) References Cited

U.S. PATENT DOCUMENTS

| | | | |
|---|---|---|---|
| 9,343,171 B1 * | 5/2016 | Sun | G11C 16/3445 |
| 9,991,316 B2 * | 6/2018 | Zuliani | H01L 45/06 |
| 2003/0210599 A1 * | 11/2003 | McClure | G11C 29/50 365/225.7 |
| 2009/0154221 A1 | 6/2009 | Kim et al. | |
| 2014/0332749 A1 | 11/2014 | Yokoyama | |
| 2017/0373120 A1 | 12/2017 | Zuliani et al. | |

* cited by examiner

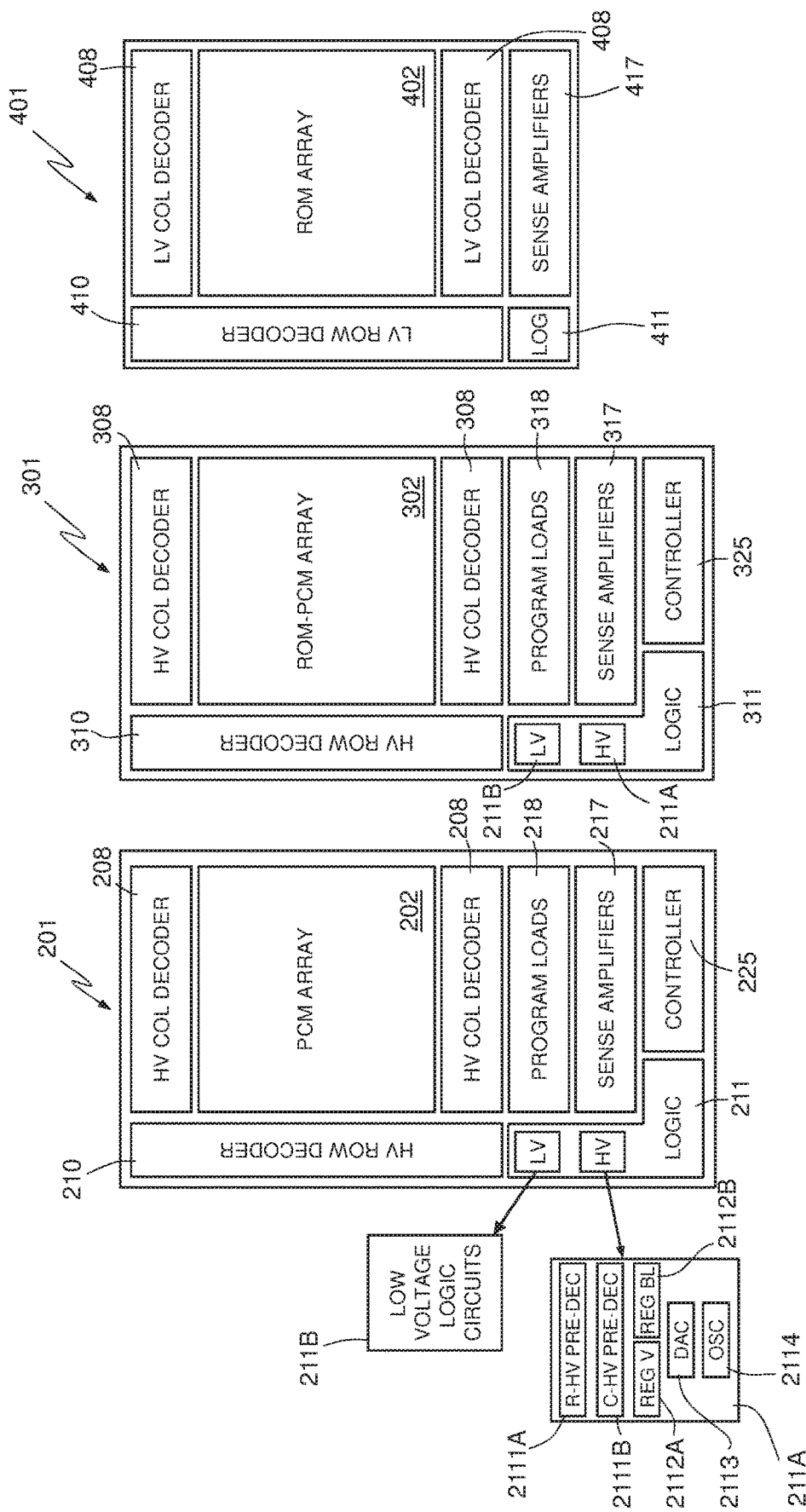

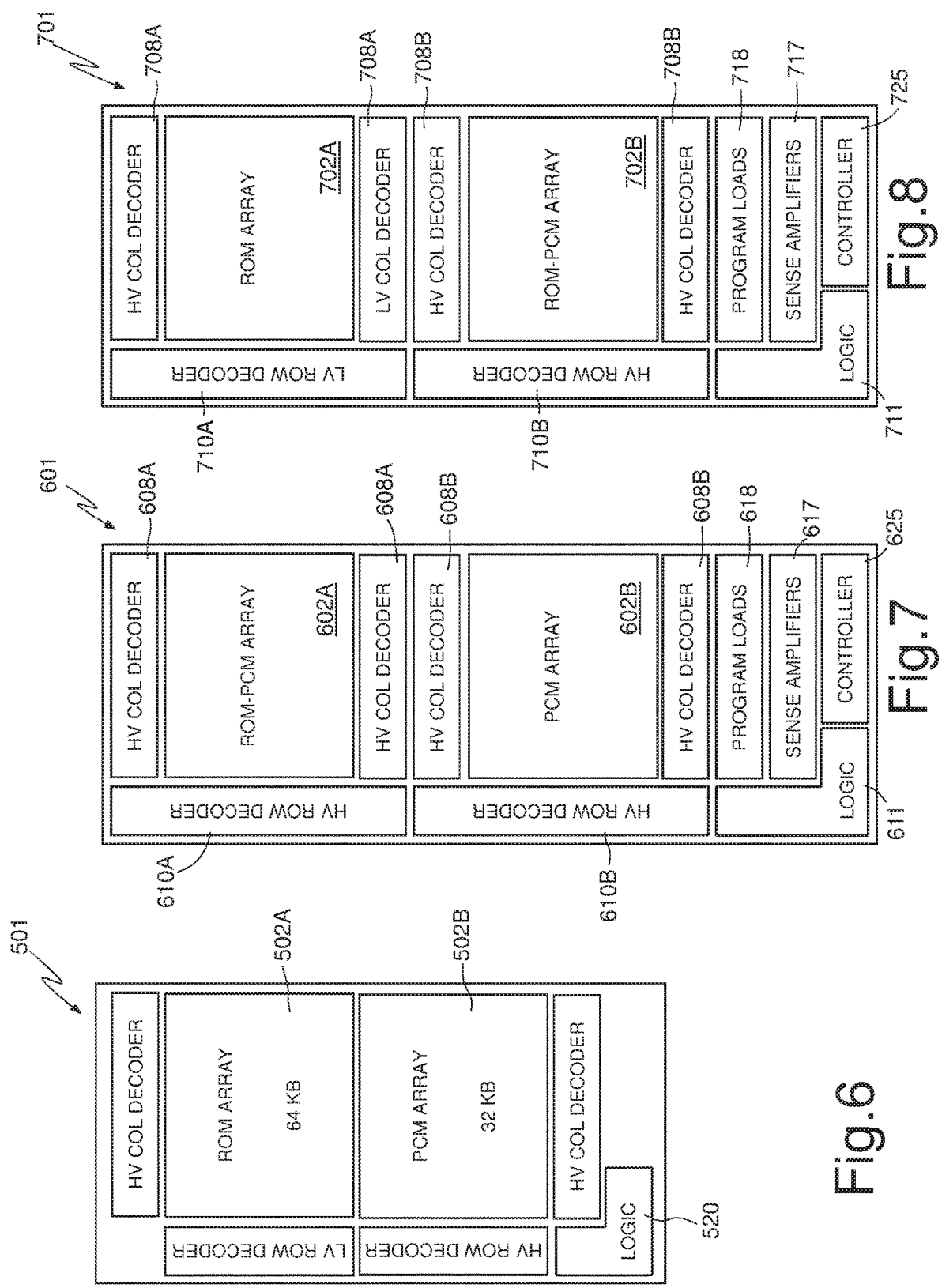

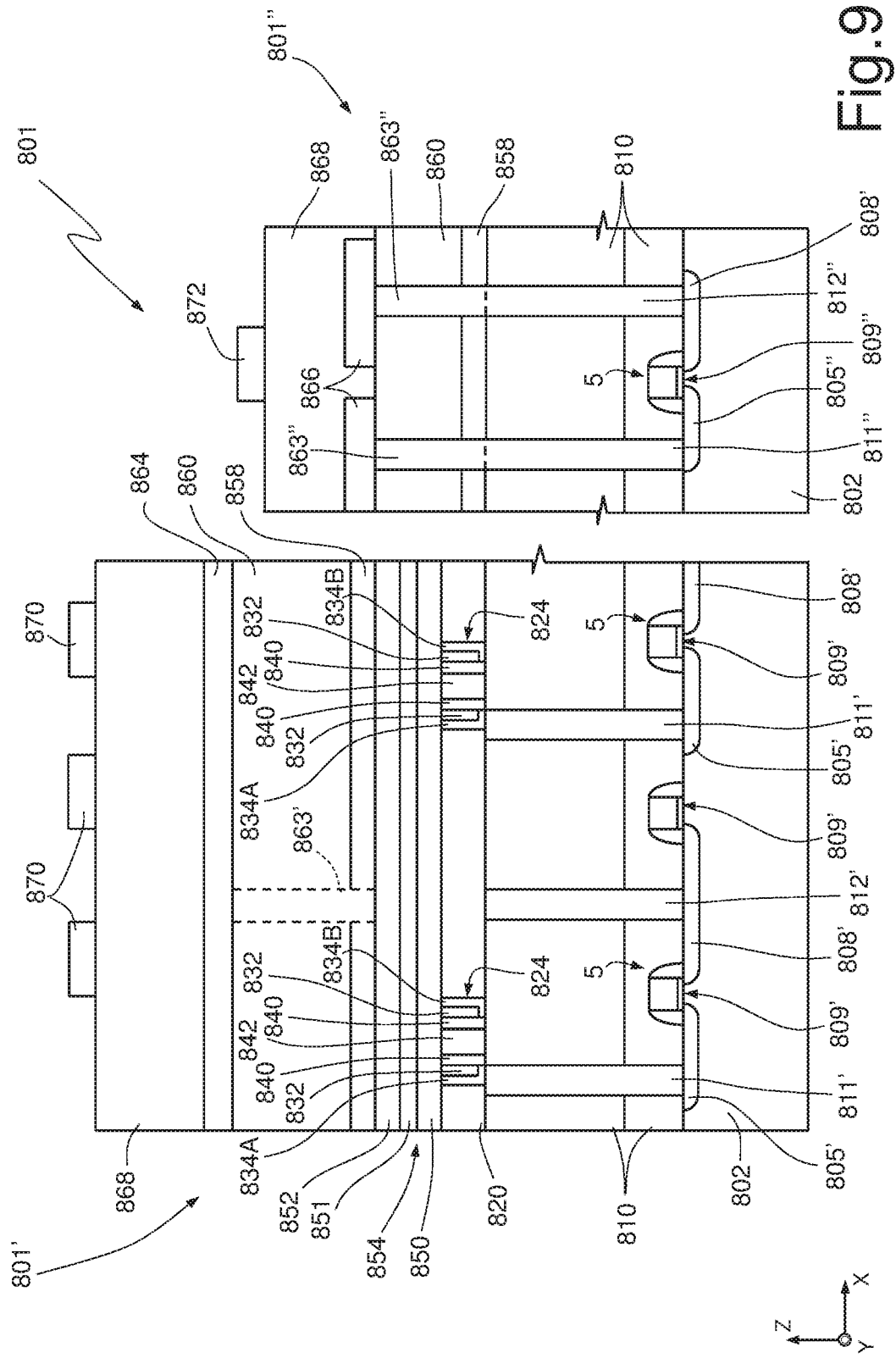

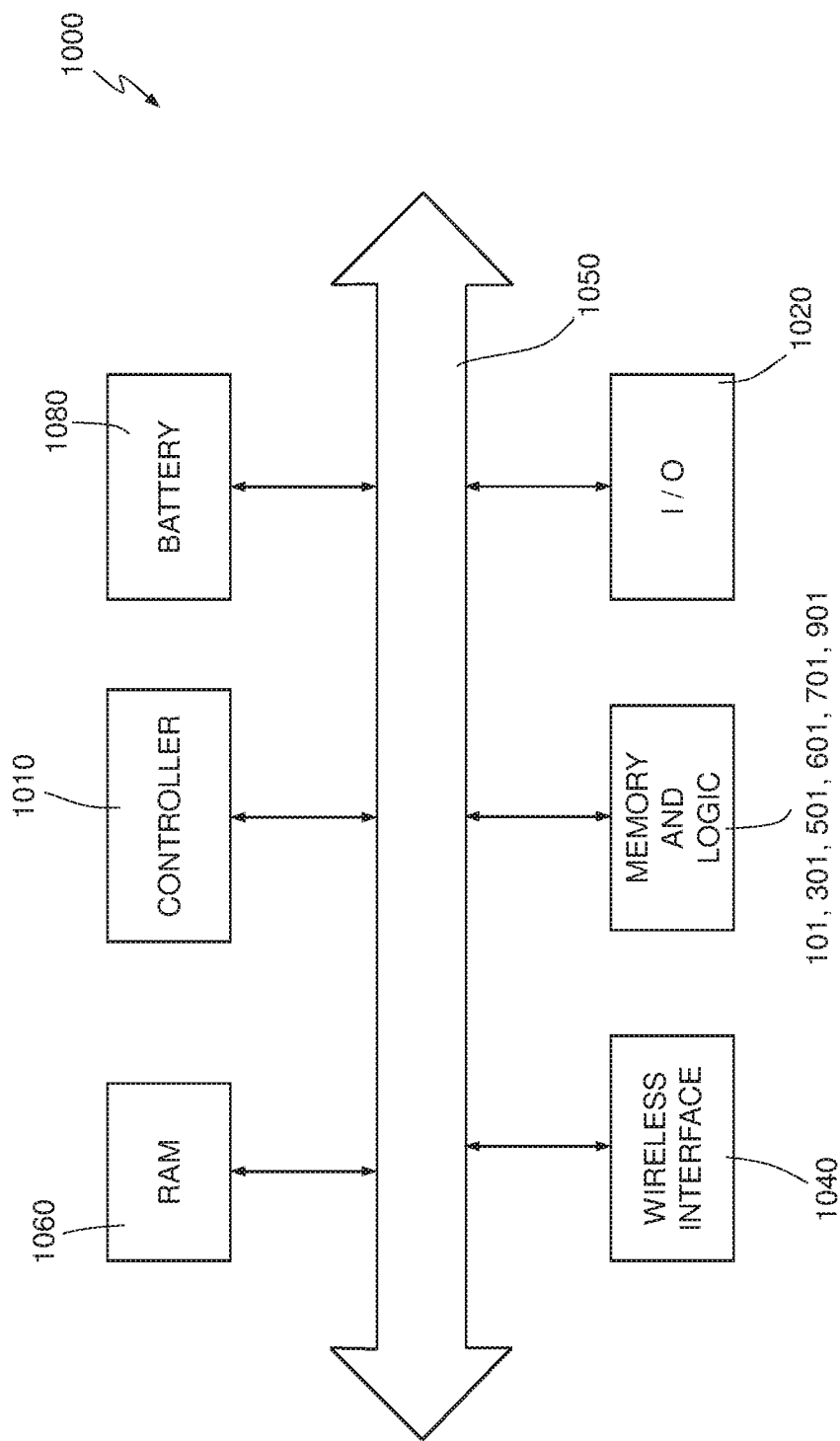

TRANSFORMED NON-REPROGRAMMABLE MEMORY ARRAY DEVICES AND METHODS OF MANUFACTURE

CROSS-REFERENCE TO RELATED APPLICATIONS

This application claims priority to Italian Patent Application No. 102017000123399, filed on Oct. 30, 2017, which application is hereby incorporated herein by reference.

TECHNICAL FIELD

The present invention relates to a non-volatile and electrically non-programmable memory device, and to the manufacturing process thereof.

BACKGROUND

As is known, "Smart Power" products are increasingly using microcontrollers. Consequently, the corresponding application programs require increased flexibility. To this end, microcontrollers embed non-volatile memories to be modified electronically, so-called eNVMs (electronic non-volatile Memories), which may be of various types, according to the needs. For instance, when it is required to store information with a lower number of bits, preferably eFTP (embedded Few Time Programmable) memories are used, in particular for storing configuration and trimming data; instead, where electronically modifiable non-volatile memories are required, for example for developing firmware code for the microcontroller, ePCMs (electronic Phase Change Memories) may be used.

Nonetheless, in many applications, when the software has been defined, reprogrammability of the memories may no longer be necessary. In this case, the addition of electronically reprogrammable memories entails additional due to the testing and masking operations, no longer necessary.

For instance, in some projects, programmability of the codes and/or data may be necessary only in an initial stage of the life of the products and, when these are in a mature stage, they can operate correctly with the simple use of non-rewritable (i.e., electrically non-modifiable) non-volatile memories, such as ROMs (Read Only Memories). This is the case, for example, in the following situations:

prototyping: in some systems, a software is developed on a product for a given application; when the software is found to function correctly, it no longer requires modifications and could be loaded into a ROM;

acquisition of new customers: in some cases, the system is adapted to the customer (customized products) on the basis of specific requirements. When the product is approved, most memories for the information and the programs can be implemented as ROMs; and reduction of the manufacturing costs: in case of mass produced products, when the application software is established, it can be stored in ROMs instead of in ePCMs.

Currently, the choice of the type of memory to be implemented in microcontrollers and smart electronic apparatuses depends upon the existing technologies, the set flexibility requirements, and the amount and length of the information to be stored. For instance, eFTP memories are increasingly used and have ever increasing dimensions, so as to be able to also satisfy the requirements of the microcontrollers. Currently, they can be used for storage requirements ranging between 128 bits up to 16 KB; instead, when a high storage capacity and code flexibility is required, ePCMs are preferably used, for example with storage capacity from 16 KB up to 1 MB.

However, the use of eNVMs (e.g., FTP memories or PCMs) when ROMs would be sufficient may entail high costs, which are not justified. For instance, for storing limited amounts of data and for small software "patch" modifications, the use of large sized eFTP memories leads to non-negligible and substantially useless costs; likewise, the presence of programming masks and testing steps in ePCMs involves high costs, which have repercussions on the costs of the final apparatus, in a way at times unacceptable.

On the other hand, the use of library ROMs for replacing eNVMs in already set projects is frequently far from practical or in any case not simple. In fact, the product and/or the apparatus should be redesigned, and therefore all the masks should be re-made and the product requalified. All these steps entail considerable time and typically customers raise objections to the introduction of modifications to the project after qualification has been obtained.

SUMMARY

Embodiments of the present invention are able to adapt eNVMs already qualified to be able to use them for applications that do not entail reprogramming.

According to the present invention, a ROM device and the manufacturing process thereof are provided.

In one embodiment, a ROM device includes a memory array including a plurality of memory cells arranged in rows and columns and coupled to word lines and bit lines. Each memory cell comprises an access transistor and a non-volatile data storage element. A high voltage column decoder stage is coupled to the bit lines a high voltage row decoder stage is coupled to the word lines. An analog stage is coupled to the high voltage row decoder and column decoder stages and comprises circuits configured to operate at a first voltage and a second voltage, higher than the first voltage. A write stage is coupled to the high voltage column decoder stage and configured to move data to be stored in the memory array from the first voltage to the second voltage. The data storage elements are electrically non-programmable and non-modifiable.

BRIEF DESCRIPTION OF THE DRAWINGS

For a better understanding of the present invention preferred embodiments thereof are now described, purely by way of non-limiting examples and with reference to the attached drawings, wherein:

FIGS. 3A, 3B, and 4-8 are schematic illustrations of the layout of NV, NM memories that can be obtained on the basis of the present description, compared to layouts of known memories;

FIG. 9 is a cross-section of a portion of ePCM array, which is the object of a prior patent application;

FIG. 15 is a simplified block diagram of a possible electronic apparatus that incorporates the present NV, NM memory.

DETAILED DESCRIPTION OF ILLUSTRATIVE EMBODIMENTS

Figure 1:
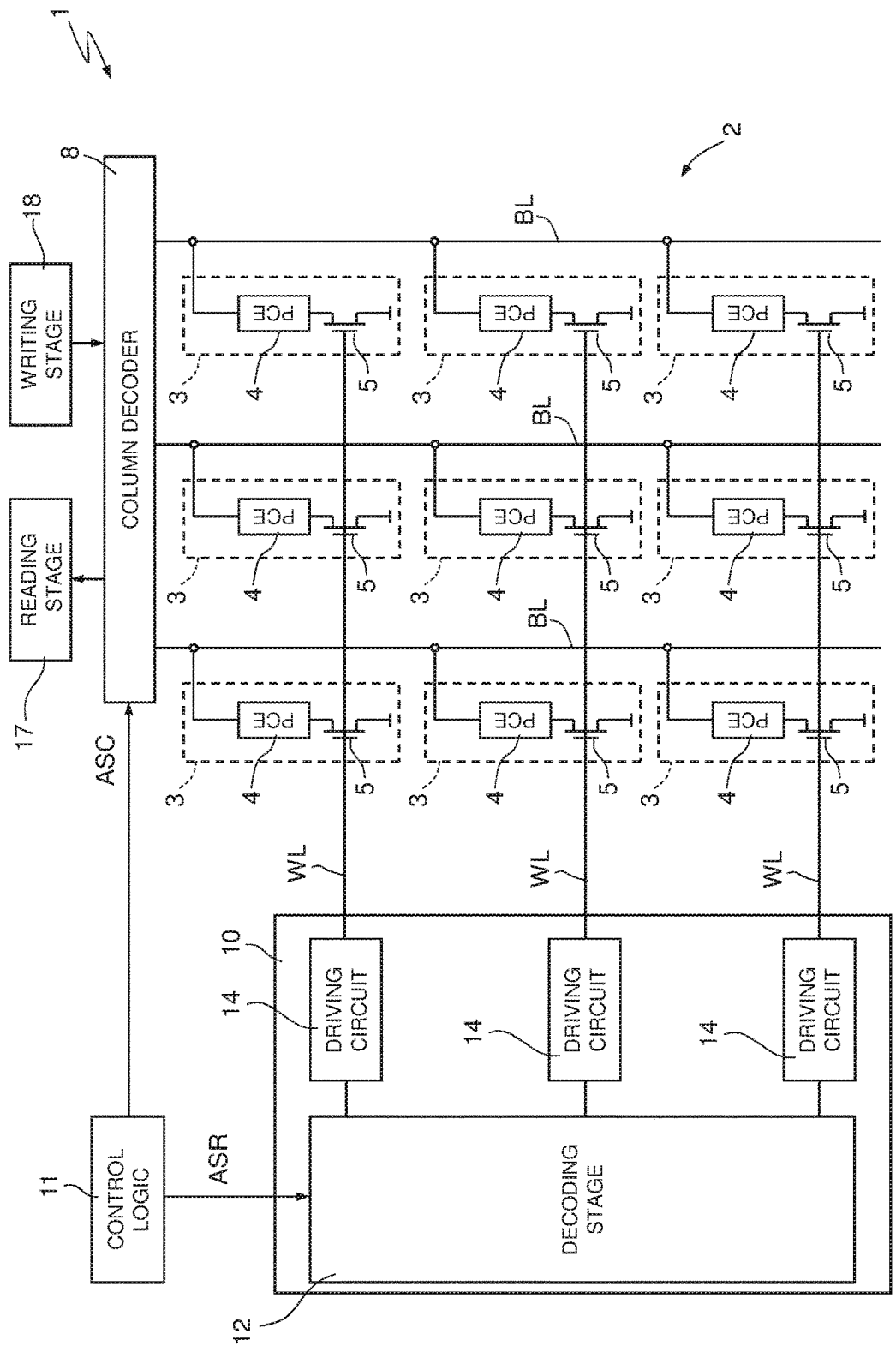
FIG. 1 shows an equivalent electrical diagram of a known ePCM.

FIG. 1 shows a PCM device 1 comprising a memory array 2 formed by a plurality of memory cells 3, arranged in rows and columns and coupled to respective word lines WL (extending parallel to the rows of the memory array 3) and to respective bit lines BL (extending parallel to the columns of the memory array 3).

Each memory cell 3 is formed by a storage element 4 and by an access (or selection) element 5, which are connected in series between a respective bit line BL and a terminal at a reference potential (e.g., ground).

The storage element 4 includes an element of phase change material (e.g., a chalcogenide, such as GST) and is consequently able to store data in the form of resistance levels associated with different phases assumed by the material. The storage element 4 has a first terminal coupled to a respective bit line BL and a second terminal coupled to the access element 5.

The access element 5 is formed by an N-channel MOSFET transistor having its drain terminal connected to the second terminal of the storage element 4, its source terminal grounded, and its gate terminal connected to a corresponding word line WL.

The PCM device 1 further comprises a column decoder 8 and a row decoder 10, for the selection of the memory cells 3, on the basis of respective address signals ASC, ASR. The address signals ASC, ASR may be generated by a control logic 11, which moreover controls the column decoder 8 and the row decoder 10 to enable reading and programming of the memory cells 3 addressed by the address signals ASC, ASR.

The row decoder 10 is designed to select, on the basis of the address signals ASR, a corresponding word line WL. To this end, the row decoder 10 comprises a decoding stage 12 and a plurality of driving circuits 14.

The column decoder 8 is designed to simultaneously select one or more bit lines BL and cooperates with the row decoder 10 to supply reading or programming voltages to a memory cell 3 selected through the respective access element 5. In particular, the column decoder 8 is configured to internally provide two distinct paths towards the selected bit lines BL: a reading path, allowing, during the reading step, connection of each selected bit line BL to a sense amplifier stage 17; and a programming path, allowing, during the programming step, connection of each selected bit line BL to a writing stage 18.

The writing stage 18 is configured to supply the programming current, which in turn depends upon the logic state to be programmed. The sense amplifier stage 17 is configured to compare the reading current that circulates in the selected memory cell 3 with a reference current, in order to determine the datum (logic level) stored in the selected memory cell 3.

In particular, according to the programming state of each cell, the latter has one of two possible states: a high resistance state (in which the storage element 4 is in a completely amorphous phase, generally associated with a logic state "0") and a low resistance state (in which the storage element 4 is in a more orderly, usually polycrystalline, phase, generally associated with a logic state "1"). In practice, during reading, the current flowing in the selected cell or cells is detected: in case of logic state "0", the current flowing in each selected cell is zero or low, whereas, in case of logic state "1", the current flowing in each selected cell is high.

Figure 2:
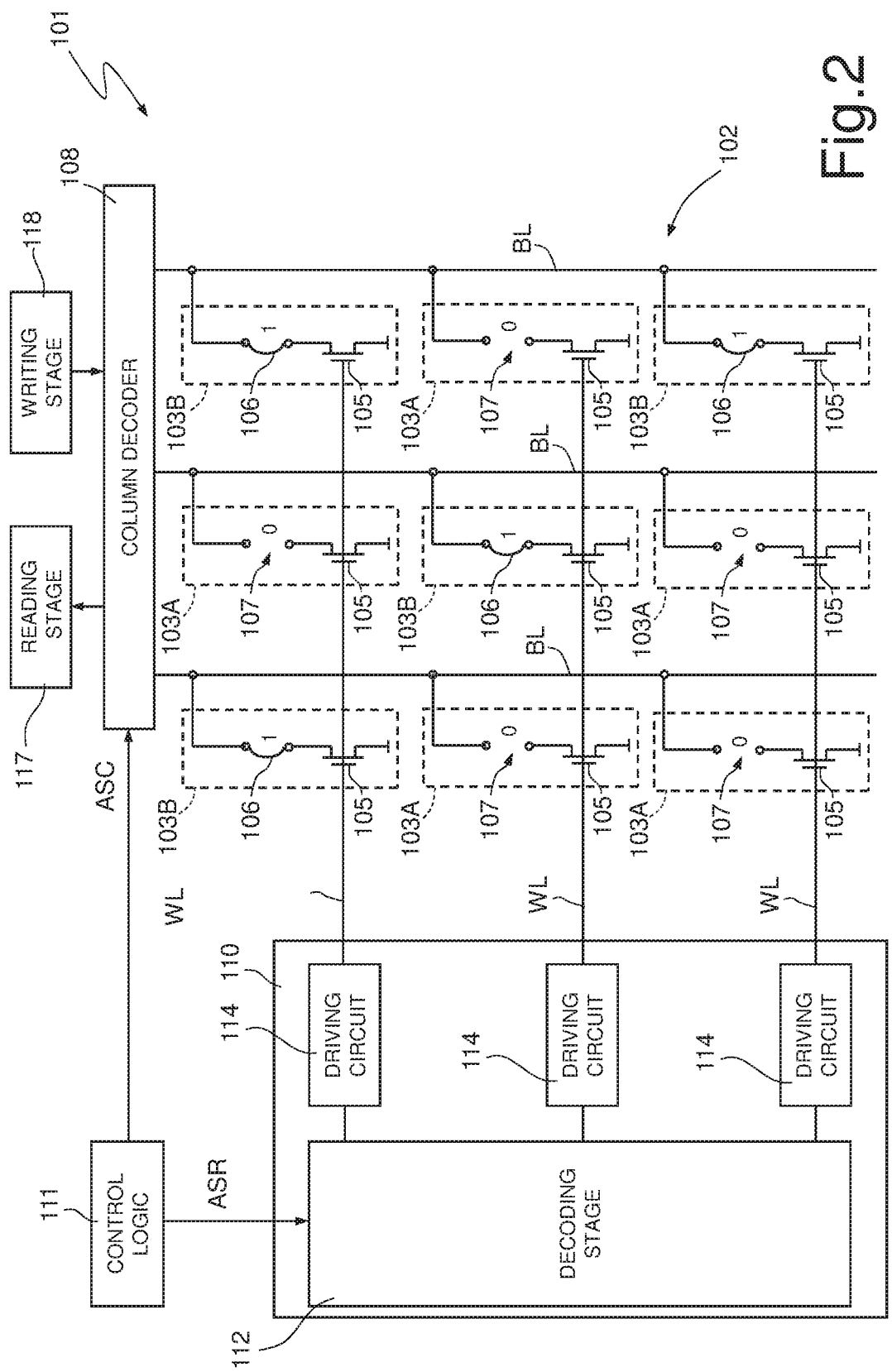
FIG. 2 shows an equivalent electrical diagram of the present non-volatile, non-modifiable (NV, NM) memory.

Thus, once programmed, the memory array 2 may be represented and, from the circuit and operating standpoints, is equivalent to the diagram of FIG. 2 (showing a memory device 101 wherein the parts corresponding to the memory device 1 of FIG. 1 have been designated by reference numbers increased by 100). Here, the logic state "0" (open circuit, here designated by 107) is represented as absence of the storage element, and the logic state "1" (closed circuit, here designated by 106) may be represented as a short circuit between the drain terminal of the respective access element 105 and the respective bit line BL.

The idea underlying the present memory device thus stems from the observation that, in applications where reprogrammability of the memory device is not required, the ePCM cell array 2 may be transformed into a transformed non-reprogrammable memory array (ROM) 102 comprising memory cells 103A storing the logic state "0" and memory cells 103B storing the logic state "1", that are made differently. In detail, in the memory cell 103A storing the logic state "0" the drain terminal of the access element 105 is disconnected from the respective bit line BL, and in the memory cell 103B storing the logic state "1" the drain terminal of the access element 105 is connected via a conductive path (e.g., a metal path) to the respective bit line BL.

The above solution allows some process steps and some layers to be eliminated, but, at the same time, the control circuits (addressing, reading, driving, writing circuits) to be maintained, and thus does not require complete redesign and requalification.

FIGS. 3A, 3B, 4, and 5 show comparative layouts; namely, FIG. 3A shows the layout of a known ePCM device, FIG. 4 shows the layout of a memory device of a non-reprogrammable type, obtained by transforming an ePCM, including a memory array 102 of FIG. 2, and FIG. 5 shows the layout of a standard library ROM device.

In detail, the known ePCM device of FIG. 3A (designated by 201) typically comprises a non-volatile memory array 202 (e.g., obtained as illustrated in FIG. 1), a high voltage row decoder 210 (including, e.g., high voltage handling circuits for controlling programming of the memory cells, for example, the driving circuits 14 of FIG. 1); a pair of high voltage column decoders 208 (also including, e.g., high voltage handling circuits, not illustrated); a reading stage 217 (so-called sense amplifiers); a high voltage writing stage 218, including voltage shifters for generating and storing data to be programmed at high voltage (so-called program loads); a control logic 211 (including high voltage analog circuits 211A and low voltage logic circuits 211B); and possibly a digital controller 225.

In particular, as illustrated in FIG. 3A and FIG. 3B, the high voltage portion 211A of the control logic 211 comprises circuits such as row pre-decoders with high voltage handling 2111A, coupled to the high voltage row decoder stage 210; high voltage column pre decoders 2111B, coupled to the high voltage column decoder stages 208; high voltage regulators 2112A, coupled to the row decoder stage 210; high voltage bit line regulators 2112B, coupled to the column decoder stages 208; I/V and DA converters 2113, coupled to the reading stage 217; and oscillators 2114, coupled to the digital controller 225 for supplying the sequence of programming and verify pulses for the memory contents and reliability, generally provided, together with an error correction technique. The low voltage portion 211B of the control logic 211 may comprise a finite state machine (FSM) for carrying out memory writing and testing operations.

Likewise, the memory device of a non-reprogrammable type obtained by transformation of an ePCM (illustrated in FIG. 4 and designated by 301), comprises, in addition to a non-volatile memory array 302 (e.g., made as illustrated in FIG. 2), an HV row decoder 310 (altogether similar to the HV row decoder 210 of FIG. 3A); a pair of HV column decoders 308 (also altogether similar to the HV column decoders 208 of FIG. 3A); a reading stage 317 (altogether similar to the reading stage 217 of FIG. 3A); an HV writing stage 318 (altogether similar to the HV writing stage 218 of FIG. 3A); a control logic 311 (altogether similar to the control logic 211 of FIG. 3A and comprising the blocks of FIG. 3B); and possibly a digital controller 325 (also altogether similar to the digital controller 225 of FIG. 3A).

Instead, a library ROM (designated by 401 in FIG. 5) typically has the layout illustrated in FIG. 5 and comprises, in addition to a memory array 402 a low voltage row decoder 41o; a pair of low voltage column decoders 408; a reading stage 417; and a control logic 411 (comprising only predecoders and control stages). In a way not illustrated, the memory device 401 may possibly comprise a simple decoding and control logic circuit. In particular, the ROM 402 does not comprise high voltage handling circuits for controlling programming of the memory cells, does not comprise any writing stage, does not comprise, in the control logic 411 predecoders with high voltage handling, high voltage and bit line voltage regulators, I/V and DA converters, or oscillators.

It should be noted that, in this context, the term "high voltage" decoder, circuit or component means in general that these electrical structures operate at voltages suitable for programming a non-volatile memory in the considered technology, for example voltages ranging between 2 V and 6 V (in particular, both the high voltage elements coupled to column addressing and column decoding functions and the high voltage elements coupled to row addressing and row decoding functions operate at voltages ranging between 2 V and 6 V) and the term "low voltage" decoder, circuit, or component in general means that these electrical structures operate at the operating voltages and currents of the logic circuits for the considered technology, for example able to operate at maximum voltages of 2 V.

Since the ePCMs and the ROMs deriving from transformation are perfectly compatible, with the solution described herein it is possible to achieve different architectural schemes.

For instance, FIG. 6 shows the architecture of a memory device 501 that comprises a first memory portion 502A, a second memory portion 502B, and a logic part 520. In particular, the first memory portion 502A may be a memory array of a ROM type, made as the transformed ROM array 102 of FIG. 2, and the second memory portion 502B is of a PCM type, made as the memory array 2 of FIG. 1. Moreover, since the first memory portion 502A is obtained in the way described above, i.e., by directly connecting (via the conductive portion 107, FIG. 2) the drain terminal of the access elements 105 to the respective bit lines BL for storing a logic "1" and not by connecting the drain terminal of the access elements 105 to the respective bit lines BL for storing a logic "0" (absence of connection 106, FIG. 2), and for the rest the structure of the first memory portion 502A is identical to that of the memory portion 502B, they can be connected to the same logic part 520. The logic part 520 typically comprises just one control logic (the control logic 111 of FIG. 2) and may comprise just one row decoder (112 in FIG. 2), just one column decoder (108 in FIG. 2), just one reading stage, and just one writing stage (117 and 118 in FIG. 2). Alternatively, the blocks connected to the control logic may be duplicated, but identical, as discussed hereinafter.

In this way, in particular when the memory device 501 derives from a project based upon just one memory array of an ePCM type, a portion whereof has no need to be reprogrammed for subsequent generations of devices, considerable advantages are obtained during manufacturing and testing. In fact, as compared to an embodiment with a memory array purely of a PCM type, a reduction in the testing times is obtained; as compared to a new project that comprises a standard library ROM array, the device has a simpler structure, easy testing, and space reduction. For instance, in the case of a known BCD process, and a 96 KB memory array, wherein the reprogrammable part has dimensions equal to 32 KB and the ROM part has dimensions equal to 64 KB, a standard library ROM array would occupy 1.73 mm2 (0.9 mm2 for the library ROM part and 0.83 mm2 for the reprogrammable part), whereas a memory array formed by two parts as in FIG. 6, where the ROM part is obtained using PCM technology (and transformed as discussed herein) occupies 1.44 mm2. In this case, a saving of an area of 20% is thus obtained.

FIG. 7 shows in greater detail a possible layout for the memory device 501 of FIG. 6. In particular, in FIG. 7, the memory device, designated by 601, can derive from a project wherein the memory array was, in the initial project stage, completely reprogrammable and a first portion of memory array 602A thereof has been transformed into a ROM in a subsequent stage of the life of the memory device 601, whereas a second memory portion 602B remains of a reprogrammable type.

In detail, the ePCM device 601 (in which the parts connected to the first memory portion 602A are designated by a number followed by the letter A and the parts connected to the second memory portion 602B are designated by the same number followed by the letter B) comprises two high voltage row decoders 610A, 600B (including high voltage handling circuits, for example, the driving circuits 14 of FIG. 1); two pairs of high voltage column decoders 608A, 608B (also comprising high voltage handling circuits, not illustrated); a reading stage 617 (sense amplifiers); a writing stage 618 (program loads); a control logic 611 (including predecoders with high voltage handling, high voltage and bit line voltage regulators, I/V and DA converters, and oscillators as in FIG. 3B) and possibly a digital controller 625.

In FIG. 8, the memory device 701 is completely non-reprogrammable, with a first memory part 702A of a ROM type already in the initial project (library ROM cells) and a second memory part 702B of a ROM type obtained by transformation. In this case, two low voltage column decoders 708A and one low voltage row decoder 710A are connected to the first memory part 702A. Moreover memory device 701 has two high voltage column decoders 708B and one high voltage row decoder 710B, which are connected to the second memory part 702B; a reading stage 717; a writing stage 718; a control logic 711; and possibly a digital controller 725.

In particular, the second memory part 702B of a ROM type can be made as described with reference to FIG. 2.

In a variant of FIG. 8 (not illustrated), a third memory portion may be provided, manufactured in PCM technology and not transformed.

Hereinafter, the structural differences and the differences in the manufacturing process of memory cells in the transformed ROM array 102 will be described.

Figure 10:
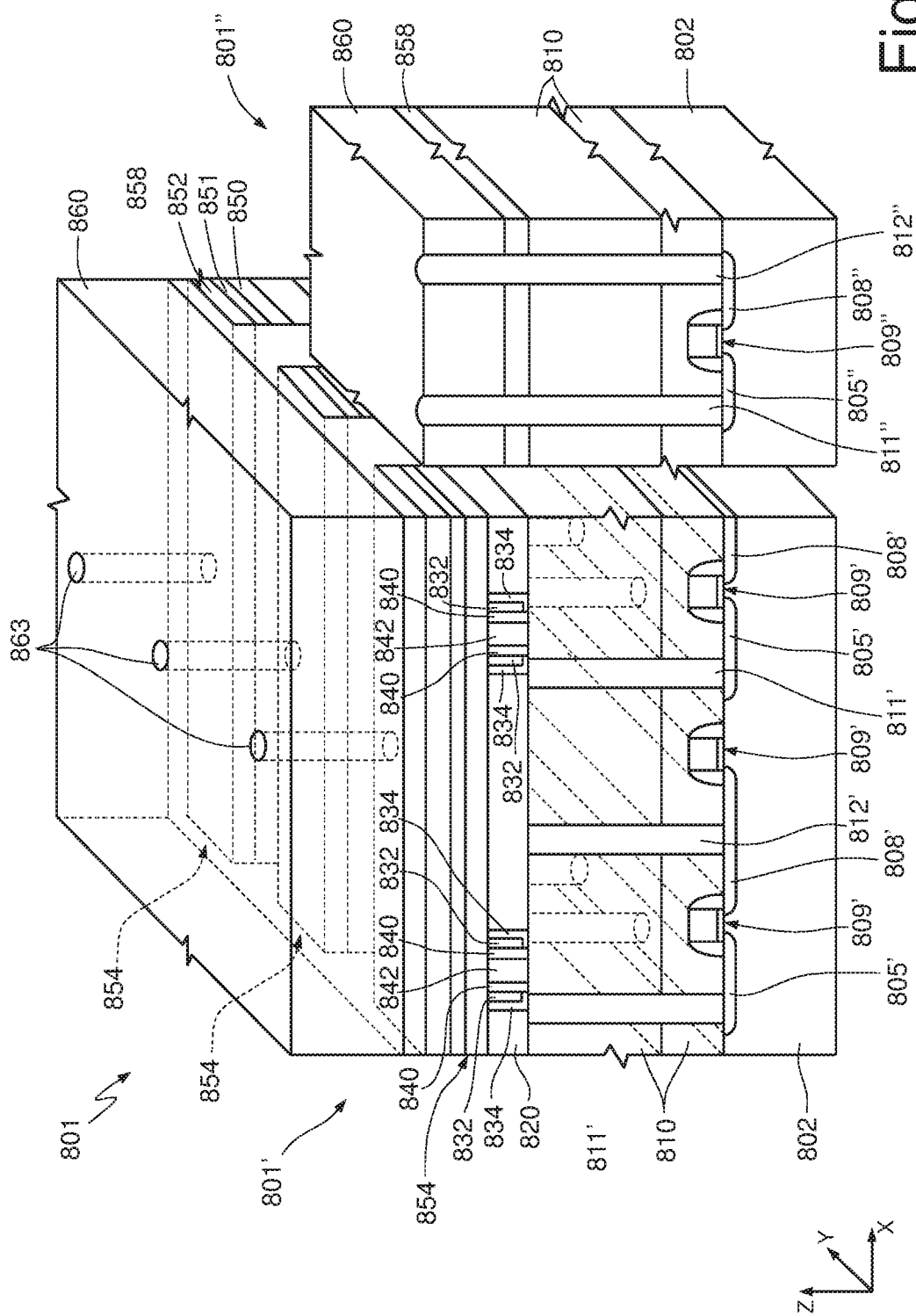
FIG. 10 is a cross-section of the portion of ePCM array of FIG. 9, with top layers removed for clarity.

For greater clarity, FIGS. 9 and 10 show the structure of a portion of a wafer 801 integrating some PCM cells 3 of FIG. 1 (memory side 801', on the left) and an analog component (logic side 801", on the right), as described in European patent application No. 16425063.1 filed on 24 Jun. 2016.

In detail, the wafer 801 comprises a substrate 802 of semiconductor material, such as monocrystalline silicon, housing drain regions 805', 805" and source regions 808', 808" (it should be noted that hereinafter similar parts are designated, on the memory side 801', by a number followed by a prime—'—and, on the logic side 801", by the same number followed by a second-prime—"—). Gate regions 809', 809" extend over the substrate 802. The substrate 802 is covered by a first dielectric layer 810 and a plurality of drain contacts 811', 811" and a plurality of source contacts 812', 812" extend therethrough. The drain contacts 811', 811" and the source contacts 812', 812" are formed by suitable photo technique (photolithography) steps for selectively removing the first dielectric layer 810 and filling with tungsten (bottom mask contacts), in a per se known manner.

The drain regions 805', the source regions 808', and the gate regions 809' on the memory side 801' form the access transistors 5 of FIG. 1, here of an NMOS type, whereas the source region 808", the drain region 805", and the gate region 809" on the logic side 801" form a transistor, for example belonging to the control logic 111 of FIG. 1.

As may be seen in FIG. 10, the source contact 812" of each access transistor 5 extends in a continuous way in the direction of the axis Y, parallel to the gate regions 809'; electrical contact of the gate regions 809' and of the source contacts 812' of the memory side 801' is provided in a dedicated area of the wafer 801 (not visible in the figure).

The drain contacts 811', 811" are shaped like pillars; drain contacts 811' belonging to a same access transistor 5 are aligned to each other in directions parallel to axis Y.

In the memory side 801', a protective layer 820, for example of silicon nitride Si3N4, extends over the first dielectric layer 810 and has trenches 824, which extend parallel to axis Y and partially laid on top of the drain contacts 811'. The trenches 824 are formed using suitable photo technique steps for selectively removing the protective layer 820 (chalcogenide mask).

Conductive bit lines 864 extend over the second dielectric layer 860 on the memory side 801' and electrical connection lines 866 extend over the second dielectric layer 86o on the logic side 801". The conductive bit lines 864 are in electrical contact with the resistive bit lines 854 through the conductive vias 863'. As illustrated in FIG. 9, a third dielectric layer 868 extends over the second dielectric layer 860 and on the memory side 801'; word lines 870, of metal, extend on the latter and are electrically coupled to the gate regions 109, in a way not illustrated. The word lines 870 are formed in a second metallization level (also referred to as Metal1), possibly together with further electrical connection lines of a second level 872 on the logic side 801".

Manufacturing of the heaters 834A requires various steps, including depositing a heater layer, of TiSiN; depositing a first protective wall layer, of nitride; first dry etching of the protective wall layer, exposing horizontal portions of the heater layer, on the bottom of the trenches 834; removing the exposed horizontal portions of the heater layer (thus obtaining the L-shape of the heaters 834A and of the portions 834B); depositing a second protective wall layer 38; second dry etching for removing the second protective wall layer from the trenches 824, for example; depositing a nitride filling layer; thinning out and chemical-mechanical polishing (CMP). For the detail regarding these steps see also US 2015/280117.

Resistive bit lines 854 extend over the protective layer 820 perpendicular to the trenches 824 and parallel to axis X (see FIG. 10), and comprise a PCM layer 850 of chalcogenic material, such as a GST (Ge—Sb—Te) compound, e.g., Ge2Sb2Te5; a barrier layer 851, of metal material, for example TiN; and a hard-mask layer 852, for example, of silicon nitride. For forming the resistive bit lines 854, three deposition steps are carried out (PCM, barrier, and hard-mask layers), and a photolithographic and etching step (enabling removal also of part of the protective layer 820 and of the layers forming the regions 834, 832, 840 between the resistive bit lines 854, on the memory side 801', and complete removal thereof on the logic side 801"; resistive bit line mask). The barrier layer 851 here forms a first metallization level (also referred to as Metal0).

A sealing layer 858 of dielectric material, for example silicon nitride, extends over and between the resistive bit lines 854, on the memory side 801', and over the first dielectric layer 810, on the logic side 801".

A second dielectric layer 860, for example, of silicon oxide, extends over the sealing layer 858 and houses conductive vias 863', 863". The conductive vias 863', on the memory side 801', are aligned, in direction Z, to respective resistive bit lines 854 and are in direct electrical contact therewith; the conductive vias 863", on the logic side 801", are aligned, in direction Z, to respective drain contacts 811" and source contacts 812".

Conductive bit lines 864 extend over the second dielectric layer 860 on the memory side 1' and electrical connection lines 866 extend over the second dielectric layer 860 on the logic side 1". The conductive bit lines 864 are in electrical contact with the resistive bit lines 854 through the conductive vias 863'. As illustrated in FIG. 9, a third dielectric layer 868 extends over the second dielectric layer 860 and on the memory side 801'; word lines 870, of metal, extend on the latter and are electrically coupled to the gate regions 109, in a way not illustrated. The word lines 870 are formed in a second metallization level (also referred to as Metal1), possibly together with further electrical connection lines of a second level 872 on the logic side 801".

Forming the transformed ROM array 102 enables simplification of the structure illustrated in FIGS. 9 and 10 and reduction of the number of processing steps, including three masks, as explained in detail with reference to FIGS. 11-14.

Figure 11:
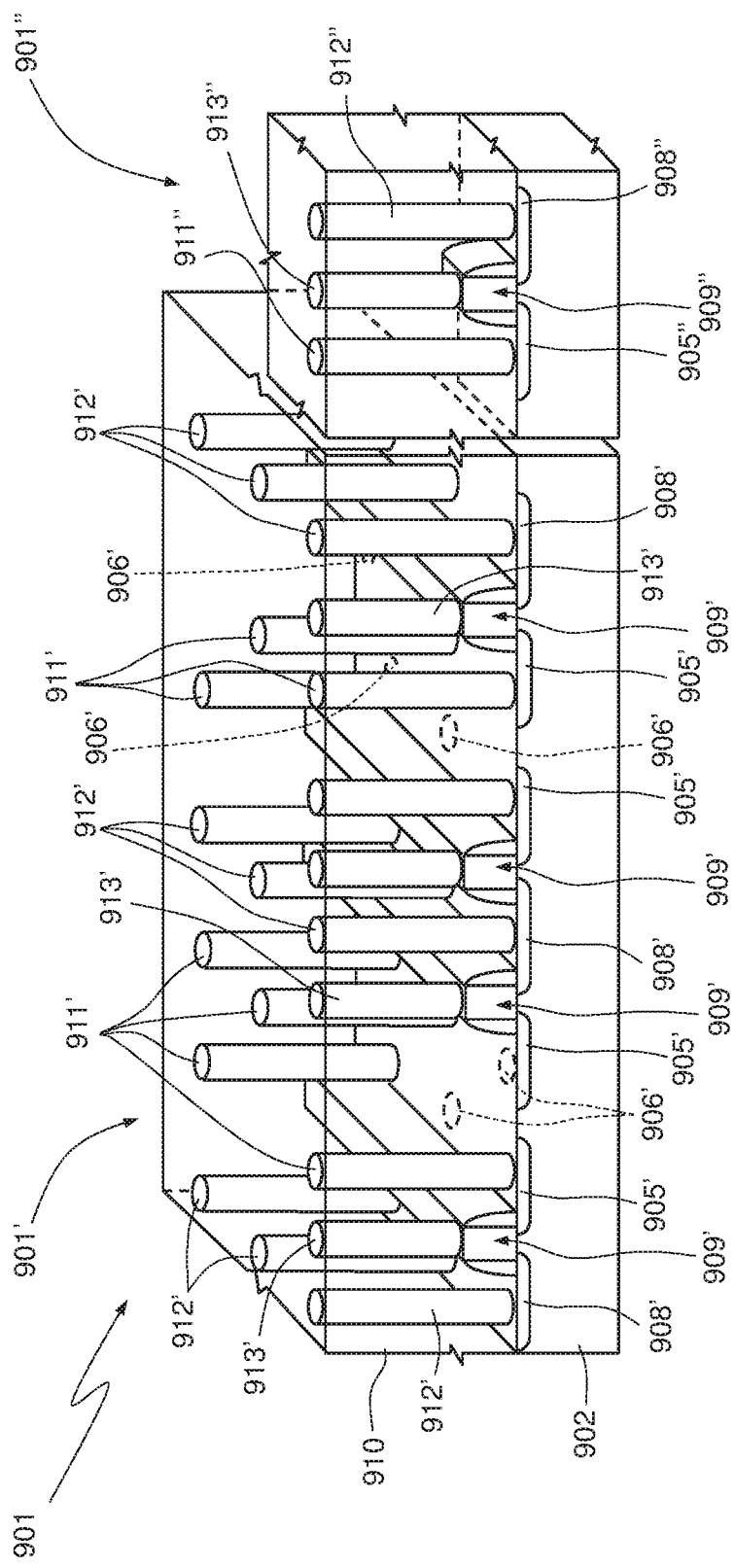
FIGS. 11-14 are cross-sections of a portion of the present NV, NM memory array in successive manufacturing steps.
Figure 12:
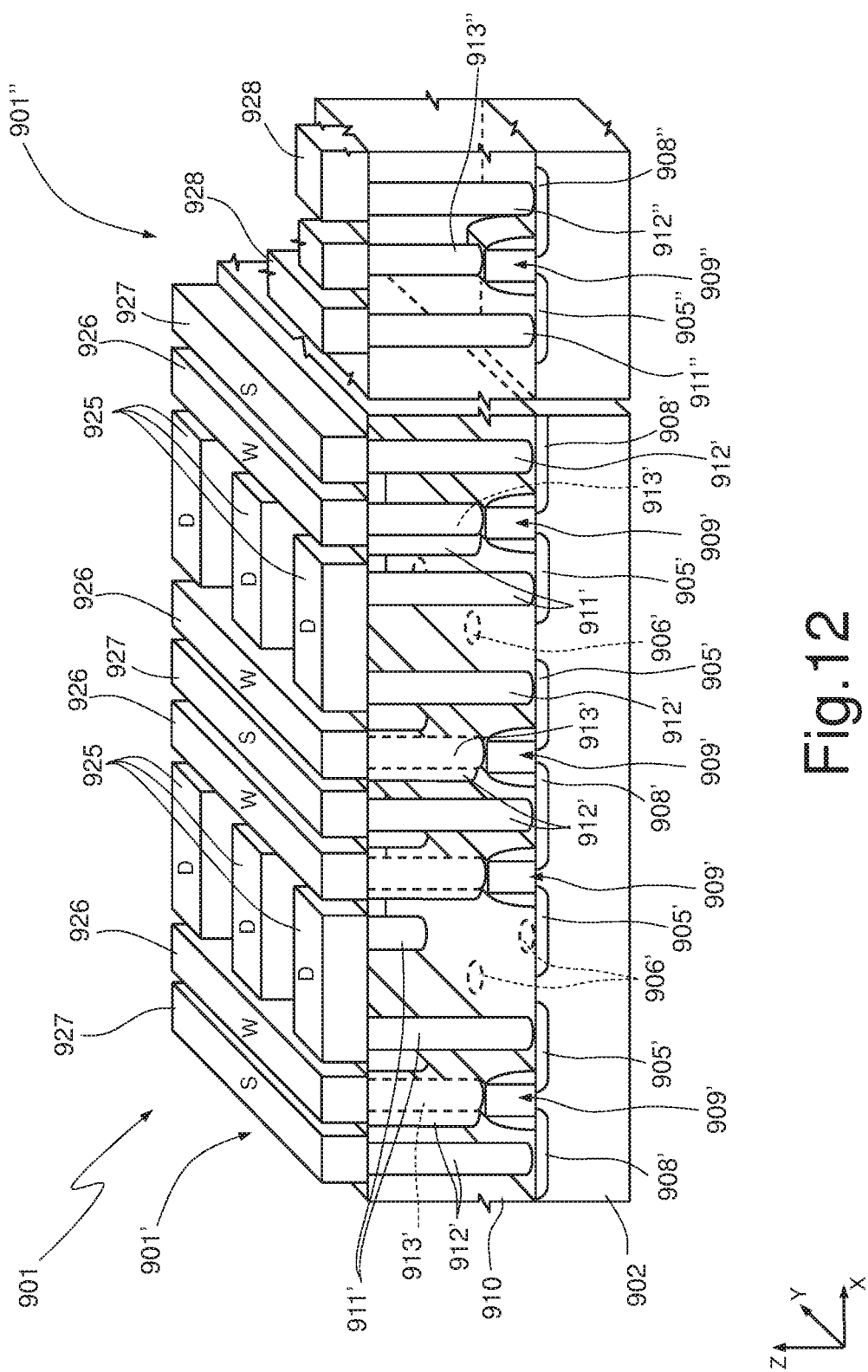
Figure 13:
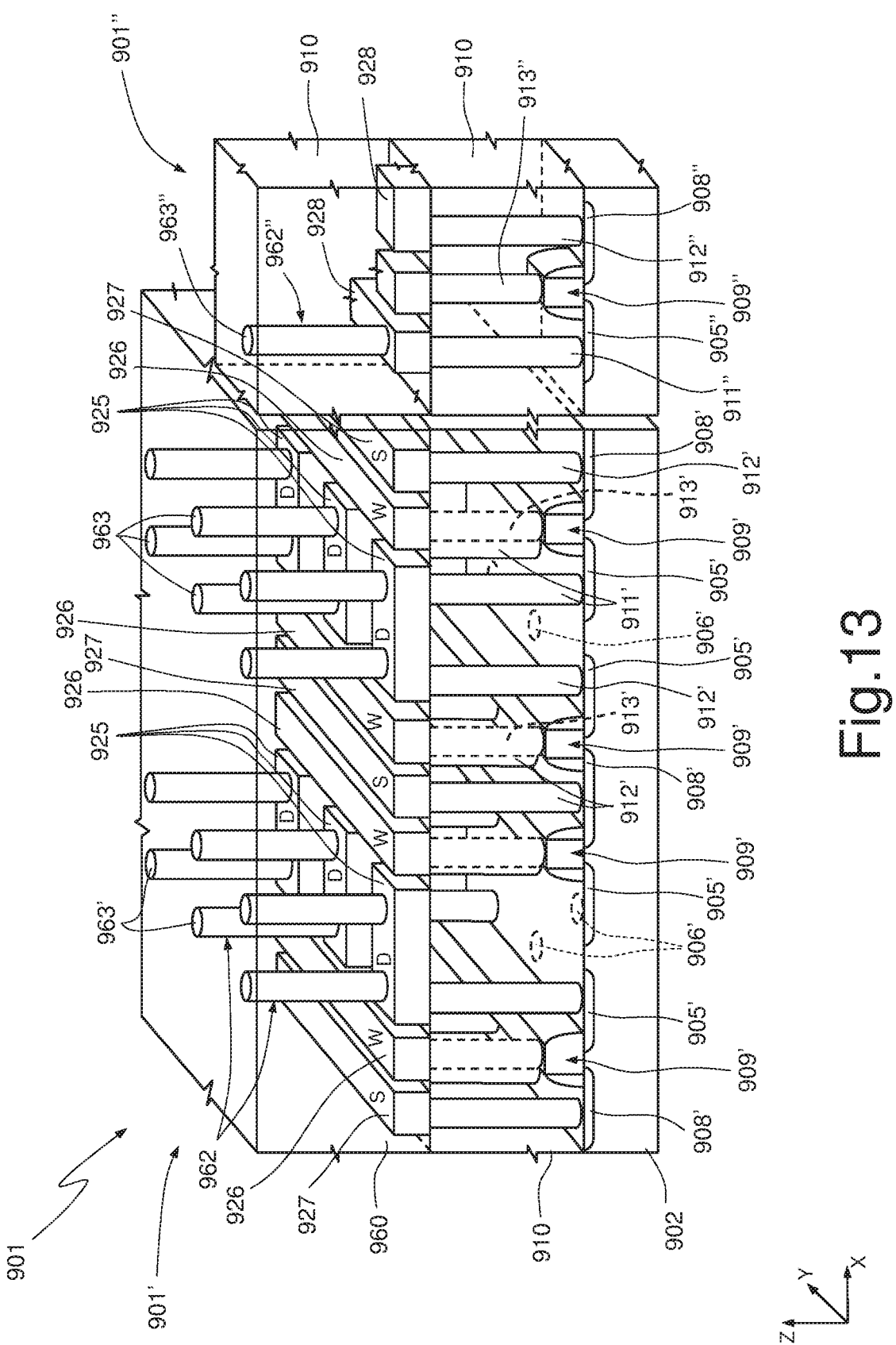
Figure 14:
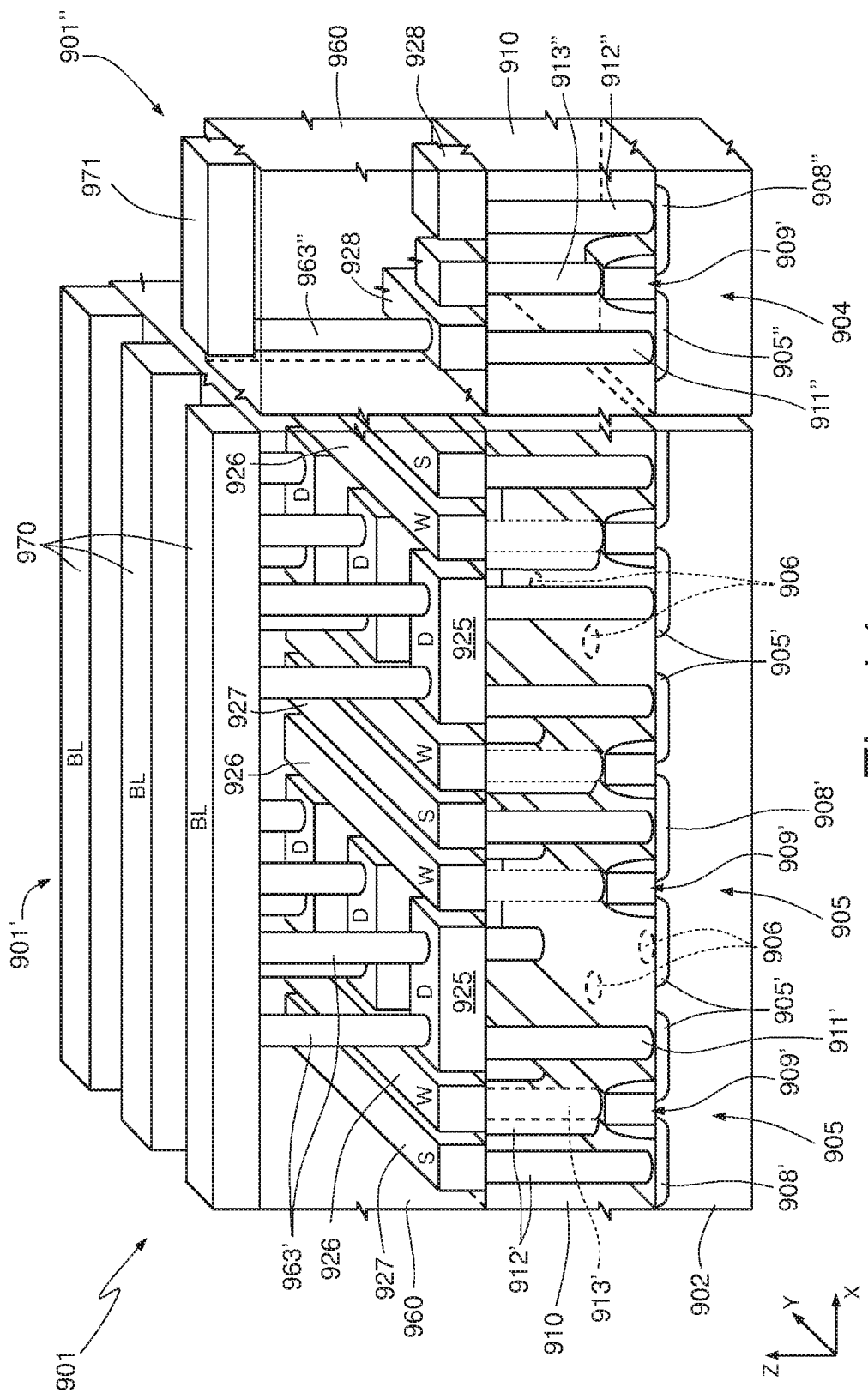

FIG. 11 shows a wafer 901 already integrating some regions intended to form the PCM cells 103A and 103B of FIG. 2 (memory side 901', on the left) and a logic component (logic side 901", on the right).

In detail, the wafer 901 comprises (like wafer 801 of FIGS. 9 and 10, so that corresponding parts are designated by reference numbers increased by 100) a substrate 902 of semiconductor material, such as monocrystalline silicon, housing drain regions 905', 905" and source regions 908', 908"; gate regions 909', 909" extend on the substrate 902. The drain regions 905', source regions 908', and gate regions 909' on the array side 901' extend parallel to each other, parallel to axis Y. A first dielectric layer 910 extends over the substrate 902 and the gate regions 909', 909"; a plurality of drain contacts 911', 911", a plurality of source contacts 912', 912", all pillar-like shaped, and a plurality of gate contacts 913', 913" extend through dielectric layer 91o (it should be noted that the gate contacts 913' are represented dashed in so far as they are present only every 128 memory cells and generally staggered with respect to the drain regions 905' and source regions 908'); the drain contacts 911" are in electrical contact with the drain regions 905', 905"; the source contacts 912', 912" are in electrical contact with the source regions 908', 908"; and the gate contacts 913', 913" are in electrical contact with the gate regions 909', 909" (in particular, in a known way, a gate contact 913', 913" is formed every 128 bit lines BL). The drain contacts 911', 911", source contacts 912', 912", and gate contacts 913', 913" are, for example, of tungsten, formed by masked etching the first dielectric layer 910, filling with tungsten, and planarization.

It should be noted that, unlike FIGS. 9 and 10 and as explained more fully hereinafter, the drain contacts 911' are no longer distributed in a regular way alongside the gate regions 909' in direction Y, but some of them are missing, as represented schematically in FIG. 11 by circles 906 (represented dashed).

Next (FIG. 12), a first metal layer (e.g., of aluminum or copper) is deposited and defined to form drain contact regions 925, word lines 926, and source lines 927, on the array side 901', and first connection lines 928, on the logic side 901". In detail, the source lines 927 and word lines 926 extend parallel and are vertically aligned to the respective source regions 908' and gate regions 909', and thus to axis Y, whereas the drain contact regions 925 are formed by portions extending here perpendicular to the word lines 926 and to the source lines 927 (parallel to axis X), between adjacent pairs of word lines 926. The source regions 908' are directly connected to the source lines 927 through the source contacts 912', the drain regions 905' are directly connected to the drain contact regions 925 through the drain contacts 911' (where present), whereas the gate regions 909' are connected to the word lines 926 by conductive vias 913' that extend through the first dielectric layer 910. The first connection lines 928, on the logic side 901", have a shape and extension chosen by the designer, on the basis of the desired electrical connections, in a per se known manner.

It should be noted that the first metal layer forming the drain contact regions 925, the word lines 926, the source lines 927, and the first connection lines 928 is a first metal level in the manufacturing process, similar to Metal1 of the process of FIGS. 9 and 10.

Then (FIG. 13), a second dielectric layer 960, for example, of silicon oxide, is deposited on the first dielectric layer 910 and on the regions 925-928. Then, using lithographic and etching steps, a plurality of openings 962', 962" is formed in the dielectric layer 960. In particular, the openings 962' on the memory side 901' are aligned, along the axis Z, to respective drain contact regions 925. The openings 962" on the logic side 901" (just one whereof is illustrated) are arranged to contact the first connection lines 928, when envisaged in the project.

Next, the openings 962', 962" are filled with conductive material, for example metal material, such as tungsten, to form second conductive vias 963' in electrical contact with the drain contact regions 925 (memory side 901') and second conductive vias 963" in electrical contact with the first connection lines 928 (logic side 901").

Next (FIG. 14), a second metal layer is deposited and photolithographically defined to form the bit lines 970 on the memory side 901' and second connection lines 971 on the logic side 901". In particular, the bit lines 970 are electrically coupled to the drain contact regions 925 by the second conductive vias 963'. The second connection lines 971 are connected to the first connection lines 928 through the second conductive vias 963", according to the project.

Usual manufacturing steps then follow, to form passivations, contact pads, etc., in a per se known manner, not described in detail.

In practice, in the memory device 901, the drain contacts 911' form a fixed, non-modifiable, connection between a drain region 905' and a respective drain contact region 925, and implement the short circuit 106 between the drain terminal of an access element 105 and the respective bit line BL of FIG. 2. Instead, the missing drain contacts 906 implement the absence 107 of the storage element of FIG. 2.

FIG. 15 shows a portion of a system 1000 including the present memory device. The system 1000 may be implemented in various devices, such as PDAs, portable computers, mobile phones, photographic cameras, video cameras, etc.

The system 1000 may include a controller 1010 (e.g., a microprocessor), an input/output device 1020, for example a keypad and a display, the present memory device 101, 301, 501, 601, 701, 901, a wireless interface 1040, and a random access memory (RAM) 1060, connected together by means of a system bus 1050. The system 1000 may be supplied by a battery 1080, or alternatively by a mains power supply source.

The memory device obtained by transformation of an ePCM described herein has numerous advantages.

As compared to an ePCM, it has far lower manufacturing costs, by eliminating the bottom contact mask, the chalcogenide mask, and the resistive bit line mask, in addition eliminating some steps linked thereto (deposition of the layers 820, 850, 851, 854, deposition and etching of the layers for forming the heaters 834 and the protective layers 832, 840, 842 in the trenches 824); and reducing by one the steps for depositing the dielectric layers (here just two, 910 and 960, instead of three 810, 860, 868 as in FIG. 9), while having different layout of the masks, for forming the word lines and source lines 826, 827 in a same step (and together with the drain contact regions 925), prior to forming the bit lines 970. As compared to a library ROM, the testing times are reduced, since the transformation of an existing project of an ePCM enables reuse of addressing, reading, and control stages already tested, thus reducing the testing operations to be carried out.

The use of a ROM array transformed from an ePCM, enables area saving with respect to a library ROM array.

The solution described is flexible and enables a transformed ROM array to be provided for the stable code parts that are not be modified, either alone or alongside an ePCM array for the parts of code that require programming, sharing some stages and control circuits with the latter.

Finally, it is clear that modifications and variations may be made to the memory device and to the manufacturing process described and illustrated herein, without thereby departing from the scope of the present invention, as defined in the attached claims.

What is claimed is:

1. A read only memory (ROM) device comprising:
    a non-programmable memory array comprising a plurality of memory cells arranged in rows and columns and coupled to word lines and bit lines, each memory cell comprising an access transistor and a non-volatile data storage element that is electrically non-programmable and non-modifiable;
    a high voltage column decoder stage coupled to the bit lines;

a high voltage row decoder stage coupled to the word lines; and a writing stage coupled to the high voltage column decoder stage and configured to program one or more programmable non-volatile data storage elements.

2. The device according to claim 1, further comprising an analog stage coupled to the high voltage row decoder stage and the high voltage column decoder stage and comprising circuits configured to operate at a first voltage and a second voltage that is higher than the first voltage.

3. The device according to claim 2, wherein the high voltage column decoder stage, the writing stage, and the high voltage row decoder stage are configured to be able to operate at the second voltage; and
wherein the analog stage comprises first circuits configured to operate at the first voltage and second circuits configured to operate at the second voltage.

4. The device according to claim 3, wherein the first voltage is at most 2 V and the second voltage is between 2 V and 6 V.

5. The device according to claim 3, wherein the first voltage is less than the second voltage, wherein the first voltage is less than about 2 V.

6. The device according to claim 2, wherein the analog stage comprises one or more row pre-decoders coupled to the high voltage row decoder stage, one or more column pre-decoders coupled to the high voltage column decoder stage, one or more high voltage regulators coupled to the high voltage row decoder stage, one or more high voltage bit line regulators coupled to the high voltage column decoder stage, current/voltage and digital-to-analog converters coupled to a reading stage, and oscillators coupled to a digital controller.

7. The device according to claim 1, wherein:
the plurality of memory cells comprises a plurality of first memory cells, each of the plurality of first memory cells having a first logic state, and a plurality of second memory cells, each of the plurality of second memory cells having a second logic state;
wherein the non-volatile data storage element of each of the plurality of first memory cells is formed by a continuous conductive path ohmically and uninterruptedly connecting the access transistor of an associated one of the plurality of first memory cells to a respective bit line; and
wherein the non-volatile data storage element of each of the plurality of second memory cells is formed by a dielectric region arranged between the access transistor of an associated one of the plurality of second memory cells and a respective bit line and electrically insulating, in an electrically non-modifiable way, the access transistor from the respective bit line.

8. The device according to claim 1, wherein the plurality of memory cells comprises a plurality of first memory cells, each of the plurality of first memory cells having a first logic state, and a plurality of second memory cells, each of the plurality of second memory cells having a second logic state, the device comprising:
a substrate of semiconductor material comprising a first conduction region and a second conduction region for each access transistor;
a first insulation layer on the substrate of semiconductor material, the first insulation layer comprising a control region for each access transistor; and
a plurality of first contact regions extending over the first insulation layer;

wherein each of the plurality of first memory cells comprises a first through contact, extending through the first insulation layer and electrically coupling the first conduction region of the access transistor of an associated one of the plurality of first memory cells to a respective first contact region of the plurality of first contact regions that is vertically aligned with the first conduction region of the access transistor of the first memory cell; and
wherein the first conduction region of the access transistor of each of the plurality of second memory cells is electrically isolated from a respective first contact region of the plurality of first contact regions that is vertically aligned with the first conduction region of the access transistor of an associated one of the plurality of second memory cells.

9. The device according to claim 8, further comprising a plurality of second contact regions extending over the first insulation layer and over the second conduction regions, the second contact regions being electrically coupled to the second conduction regions by a plurality of second through contacts extending through the first insulation layer.

10. The device according to claim 9, wherein the word lines extend over the first insulation layer, parallel to each other and to a row direction of the non-programmable memory array, wherein the second contact regions form a plurality of source lines extending parallel to each other and to the row direction, and wherein the word lines, the source lines, and the first contact regions are formed from a single metal layer.

11. The device according to claim 8, further comprising a second insulation layer on the first insulation layer, wherein the bit lines extend over the second insulation layer parallel to each other and to a column direction of the non-programmable memory array and are coupled to the first contact regions by a plurality of vias extending through the second insulation layer.

12. A read only memory (ROM) device comprising:
a non-programmable memory array comprising a plurality of memory cells arranged in rows and columns and coupled to word lines and bit lines, each memory cell comprising an access transistor and a non-volatile data storage element that is electrically non-programmable and non-modifiable, the plurality of memory cells comprising a plurality of first memory cells having a first logic state and a plurality of second memory cells having a second logic state, wherein the non-volatile data storage element of each of the plurality of first memory cells is formed by a continuous conductive path ohmically and uninterruptedly connecting the access transistor of an associated one of the plurality of first memory cells to a respective bit line, and wherein the non-volatile data storage element of each of the plurality of second memory cells is formed by a dielectric material region arranged between the access transistor of an associated one of the plurality of second memory cells and a respective bit line and electrically insulating, in an electrically non-modifiable way, the access transistor from the respective bit line; and
a writing stage coupled to the non-programmable memory array and configured to program one or more programmable non-volatile data storage elements.

13. The device according to claim 12, further comprising:
a high voltage column decoder stage coupled to the bit lines and to the writing stage;
a high voltage row decoder stage coupled to the word lines; and an analog stage coupled to the high voltage row decoder stage and high voltage column decoder stage and comprising circuits configured to operate at a first voltage and a second voltage, wherein the first voltage is at most 2 V and is less than the second voltage.

14. The device according to claim 13, wherein the second voltage is between 2 V and 6 V.

15. The device according to claim 12, wherein the device comprises:
a substrate of semiconductor material comprising a first conduction region and a second conduction region for each access transistor;
a first insulation layer on the substrate of semiconductor material, the first insulation layer comprising a control region for each access transistor; and
a plurality of first contact regions extending over the first insulation layer;
wherein each of the plurality of first memory cells comprises a first through contact extending through the first insulation layer and electrically coupling the first conduction region of the access transistor of the associated one of the plurality of first memory cells to a respective first contact region of the plurality of first contact regions that is vertically aligned with the first conduction region of the access transistor of the associated one of the plurality of first memory cells; and
wherein the first conduction region of the access transistor of each of the plurality of second memory cells is electrically isolated from a respective first contact region of the plurality of first contact regions that is vertically aligned with the first conduction region of the access transistor of the associated one of the plurality of second memory cells.

16. The device according to claim 15, further comprising a plurality of second contact regions extending over the first insulation layer and over the second conduction regions, the second contact regions being electrically coupled to the second conduction regions by a plurality of second through contacts extending through the first insulation layer.

17. The device according to claim 16, wherein the word lines extend over the first insulation layer, parallel to each other and to a row direction of the non-programmable memory array, wherein the second contact regions form a plurality of source lines extending parallel to each other and to the row direction, and wherein the word lines, the source lines, and the first contact regions are formed from a single metal layer.

18. The device according to claim 15, further comprising a second insulation layer on the first insulation layer, wherein the bit lines extend over the second insulation layer parallel to each other and to a column direction of the non-programmable memory array and are coupled to the first contact regions by a plurality of vias extending through the second insulation layer.

19. A method for manufacturing a ROM device, the method comprising:
forming a plurality of memory cells arranged in an array of rows and columns and coupled to word lines and bit lines, each memory cell comprising an access transistor and a non-volatile data storage element that is non-programmable and non-modifiable;
forming a high voltage column decoder stage coupled to the bit lines;
forming a high voltage row decoder stage coupled to the word lines; and
forming a writing stage coupled to the high voltage column decoder stage and configured to program one or more programmable non-volatile data storage elements.

20. The method according to claim 19, wherein forming the plurality of memory cells comprises forming a plurality of first memory cells each of the plurality of first memory cells storing a first logic state and forming a plurality of second memory cells each of the plurality of second memory cells storing a second logic state,
wherein forming the plurality of first memory cells comprises forming a plurality of continuous conductive paths each continuous conductive path of the plurality of continuous conductive paths ohmically and uninterruptedly connecting the access transistor of an associated one of the plurality of first memory cells to a respective bit line; and
wherein forming the plurality of second memory cells comprises forming a plurality of regions of dielectric material each region of dielectric material of the plurality of regions of dielectric material being arranged between the access transistor of an associated one of the plurality of second memory cells and a respective bit line and electrically insulating, in an electrically non-modifiable way, the access transistor of the associated one of the plurality of second memory cells from the respective bit line.

21. The method according to claim 20, comprising:
forming, in a substrate of semiconductor material, a first conduction region and a second conduction region for each access transistor;
forming a first insulation layer on the substrate of semiconductor material;
forming a control region for each access transistor in the first insulation layer; and
forming a plurality of first contact regions on the first insulation layer,
wherein forming each continuous conductive path of the plurality of continuous conductive paths comprises forming a first through contact through the first insulation layer between the first conduction region of the associated one of the plurality of first memory cells and a respective first contact region of the plurality of first contact regions that is vertically aligned with the first conduction region of the associated one of the plurality of first memory cells.

22. The method according to claim 21, wherein forming the first through contact through the first insulation layer comprises selectively removing portions of the first insulation layer to form a contact opening and filling the contact opening with electrically conductive material.

23. The method according to claim 21, further comprising forming a plurality of second contact regions on the first insulation layer and forming a second through contact between each second conduction region and a respective second contact region of the plurality of second contact regions.

24. The method according to claim 23, further comprising forming the word lines on the first insulation layer, wherein forming a plurality of first contact regions, forming a plurality of second contact regions, and forming the word lines comprise forming a metal layer and defining a first metal layer.

25. The method according to claim 21, further comprising forming a second insulation layer on the first insulation layer, forming a plurality of through vias through the second insulation layer each through via being electrically coupled to a respective first contact region of the plurality of first contact regions, and forming the bit lines on the second insulation layer and in electrical contact with the plurality of through vias.

26. The method according to claim 19, further comprising forming an analog stage coupled to the high voltage row decoder stage and the high voltage column decoder stage and comprising circuits configured to operate at a high voltage and at a low voltage.

27. A method of making a non-programmable memory device based on a mask set used to form a programmable memory device, the method comprising:
   forming a modified mask set based on the mask set used to form the programmable memory device; and
   fabricating the non-programmable memory device using the modified mask set.

28. The method according to claim 27, further comprising:
   fabricating the programmable memory device using the mask set;
   programming the programmable memory device;
   testing the programmed programmable memory device; and
   designing the modified mask based on the mask set and results of the testing.

29. The method according to claim 27, wherein the non-programmable memory device comprises:
   a non-programmable memory array comprising a plurality of memory cells arranged in rows and columns and coupled to word lines and bit lines, each memory cell comprising an access transistor and a non-volatile data storage element that is electrically non-programmable and non-modifiable;
   a high voltage column decoder stage coupled to the bit lines;
   a high voltage row decoder stage coupled to the word lines;
   an analog stage coupled to the high voltage row decoder stage and the high voltage column decoder stage and comprising circuits configured to operate at a first voltage and a second voltage that is higher than the first voltage; and
   a writing stage coupled to the high voltage column decoder stage and configured to program one or more programmable non-volatile data storage elements of the programmable memory device.

* * * * *